United States Patent [19]

Chelluri et al.

[11] Patent Number: 5,611,139
[45] Date of Patent: Mar. 18, 1997

[54] STRUCTURE AND METHOD FOR COMPACTION OF POWDER-LIKE MATERIALS

[75] Inventors: Bhanumathi Chelluri, Dublin; John P. Barber, Kettering; Duane C. Newman, London, all of Ohio

[73] Assignee: IAP Research, Inc., Dayton, Ohio

[21] Appl. No.: 417,919

[22] Filed: Apr. 6, 1995

Related U.S. Application Data

[63] Continuation-in-part of Ser. No. 834,148, Feb. 10, 1992, Pat. No. 5,405,574.

[51] Int. Cl.$^6$ .............................. B23P 19/00; C21D 1/04
[52] U.S. Cl. .................... 29/744; 148/108; 428/558
[58] Field of Search ..................... 148/108; 428/558; 29/744

[56] References Cited

U.S. PATENT DOCUMENTS

| | | | |
|---|---|---|---|
| 2,976,907 | 3/1961 | Harvey et al. | 153/10 |
| 3,346,914 | 10/1967 | Sandstrom et al. | 18/5 |
| 3,596,350 | 8/1971 | Steingroever et al. | 29/608 |
| 4,297,388 | 10/1981 | Kumar et al. | 427/47 |
| 4,592,889 | 1/1986 | Leupold et al. | 419/66 |
| 4,717,627 | 1/1988 | Nellis et al. | 428/552 |
| 4,762,754 | 8/1988 | Nellis et al. | 428/552 |
| 4,873,605 | 10/1989 | Drits et al. | 361/143 |
| 4,939,121 | 7/1990 | Rybka | 505/1 |
| 4,975,411 | 12/1990 | Danby et al. | 505/1 |
| 5,004,722 | 4/1991 | Tallman | 505/1 |
| 5,030,614 | 7/1991 | Hollinder et al. | 505/1 |
| 5,057,486 | 10/1991 | Arendt et al. | 505/1 |
| 5,079,225 | 1/1992 | Holloway | 505/1 |
| 5,079,534 | 1/1992 | Steingroever et al. | 335/284 |
| 5,096,880 | 3/1991 | Rybka | 505/1 |
| 5,101,560 | 4/1992 | Leonard et al. | 29/890.32 |
| 5,162,296 | 11/1992 | Yamazaki | 505/1 |
| 5,250,255 | 10/1993 | Sagawa et al. | 419/38 |
| 5,262,396 | 11/1993 | Yamazaki | 505/1 |
| 5,304,983 | 4/1994 | Zhou et al. | 340/572 |
| 5,469,140 | 11/1995 | Liu et al. | 340/551 |

OTHER PUBLICATIONS

*Melt–Textured Growth of Polycrystaline,* Physical Review B. Vol. 37, No. 13. May 1, 1988, S. Gin, et al.
*High–Field Critical Current Densities,* 1989 Applied Physics Letters, p. 2441, prepared by K. Heine, et al.
*Hot Extrusion of High–Temperature Superconducting Oxides,* American Ceramic Bulletin, May 1991, p. 813, by Uthamalingam Balachandran.
*Crystallographicallyoriented superconducting $bi_2Sr_2CaCu_2O_8$ by shock compaction of prealigned powder,* Applied Physics Letters 57, Jul. 2, 1990, p. 93, by C. L. Seaman, et al.
*Metal Matrix High–Temperature Superconductor,* Advanced Materials and Processes Inc., Metal Progress, Oct. 1987, p. 37, by L. E. Murr, et al.

(List continued on next page.)

*Primary Examiner*—Peter A. Nelson
*Attorney, Agent, or Firm*—Jacox, Meckstroth & Jenkins

[57] ABSTRACT

Structure and a method for producing very dense bodies from particulate materials. An electrically conductive drive member is positioned adjacent the particulate material. A significant magnitude of electrical current is caused to flow through the electrically conductive drive member. A magnetic field is established and large magnitudes of magnetic pressure are created, and pressure directly from or indirectly from the magnetic pressure is applied upon the particulate material, and the particulate material is compressed and compacted. In one embodiment of the invention electrical current creates a magnetic field which is applied to an electrically conductive pressure member which moves and applies compaction pressure upon the particulate material. Electromagnetic pressure in accordance with this invention may be applied to a compacted body of particulate material, and the compressibility and density of the body of particulate material is increased. Any one of numerous types of particulate material may be involved with regard to this invention.

14 Claims, 3 Drawing Sheets

OTHER PUBLICATIONS

*Densification of $YBA_2Cu_2O_{7-8}$ by uniaxial pressure sintering,* Cryogenics, May 1990, vol. 30, by S. L. Town, et al.

German Publication *Planseeberichte Fur Pulvermetallurgie, Pulverdichten mit Magnetimpulsen,* dated 1976.

*Electromagnetic Forming,* Pulsed Power Lecture Series, Lecture No. 36 by J. Bennett and M. Plum.

*Dynamic Consolidation of Metal Powders* by W. H. Gourdin, Lawrence Livermore National Laboratory, Livermore, California, U.S.A., published in "Progress In Materials Science", vol. 30, pp. 39 to 80, 1986.

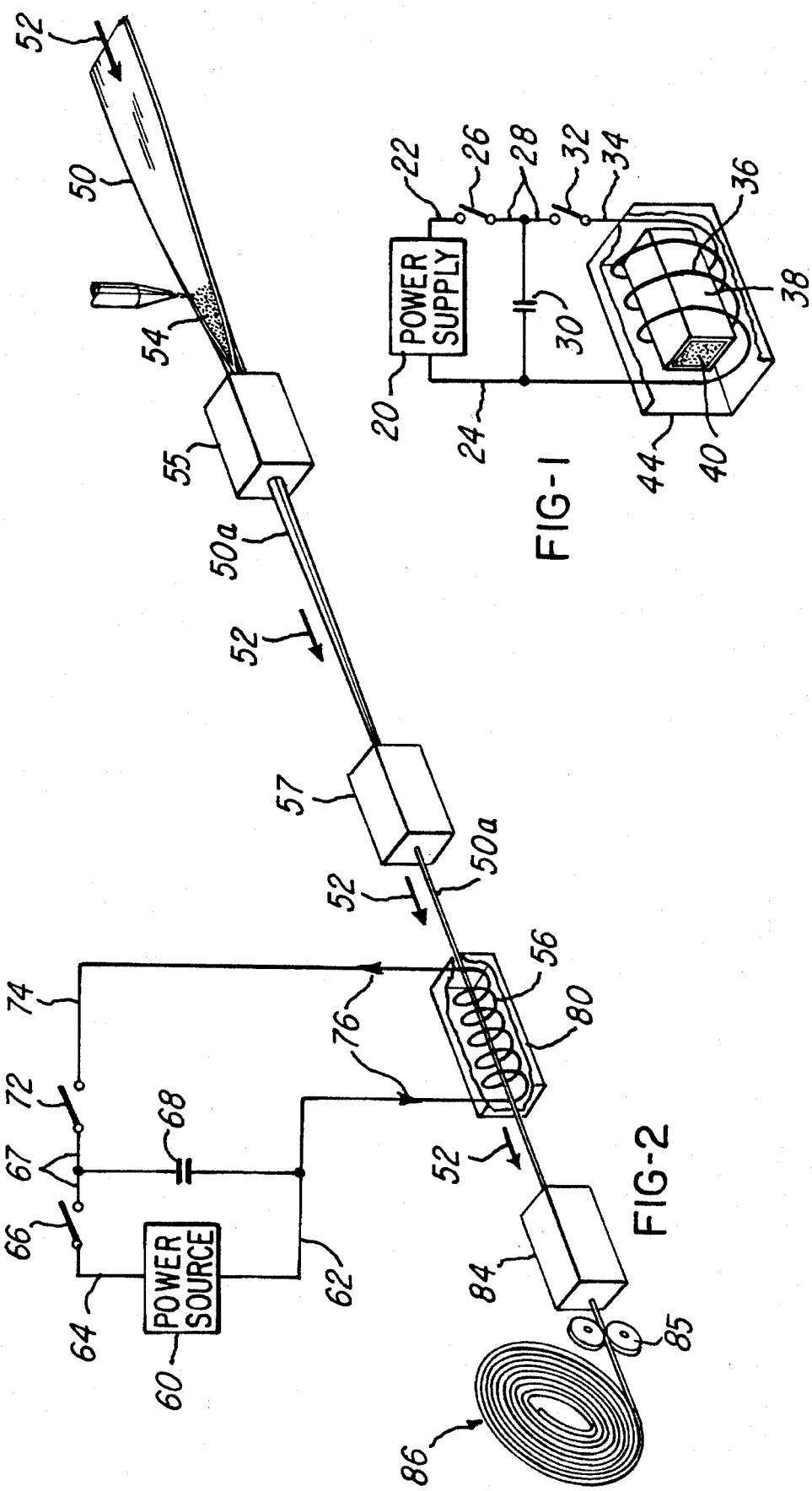

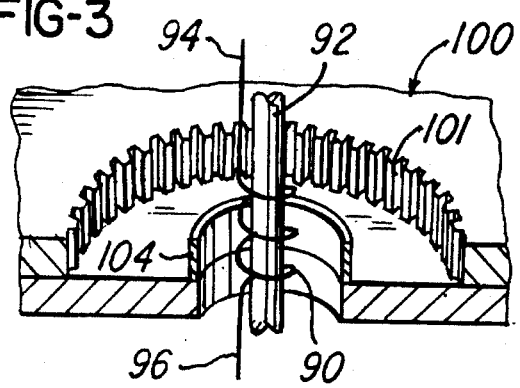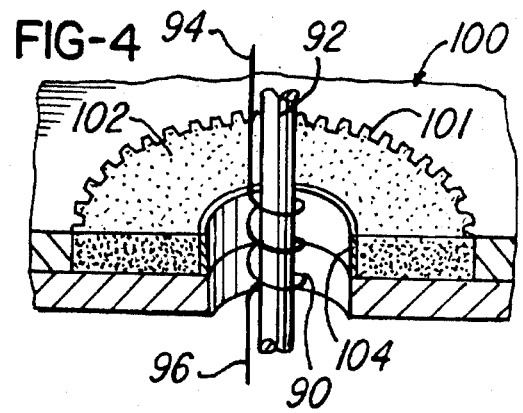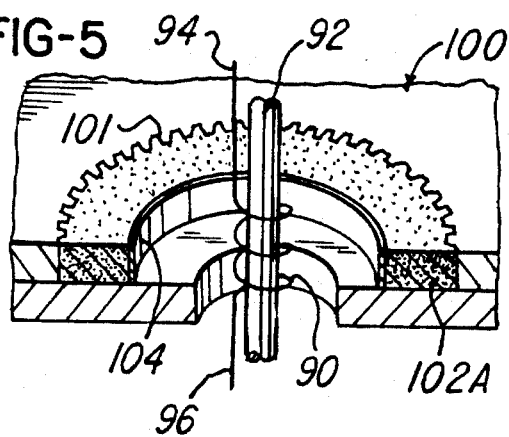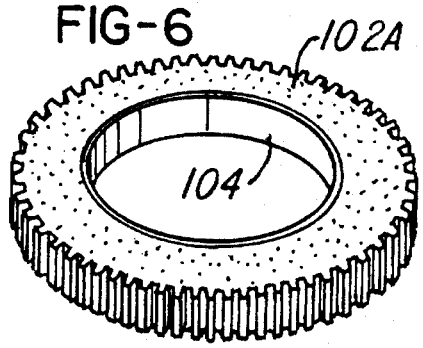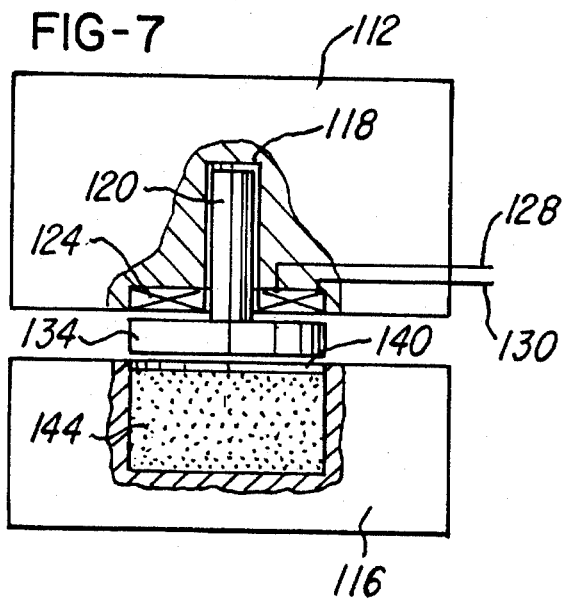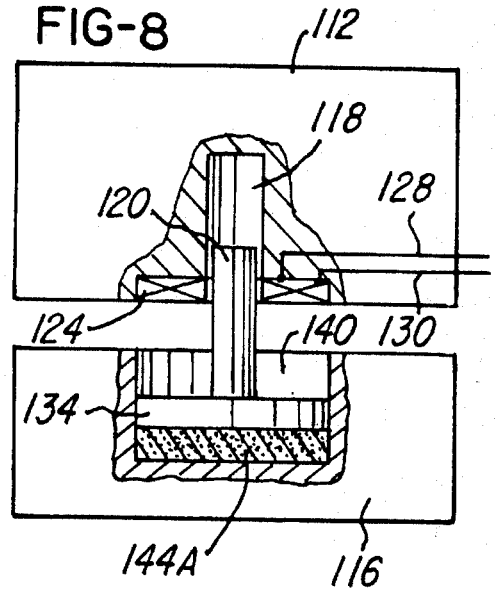

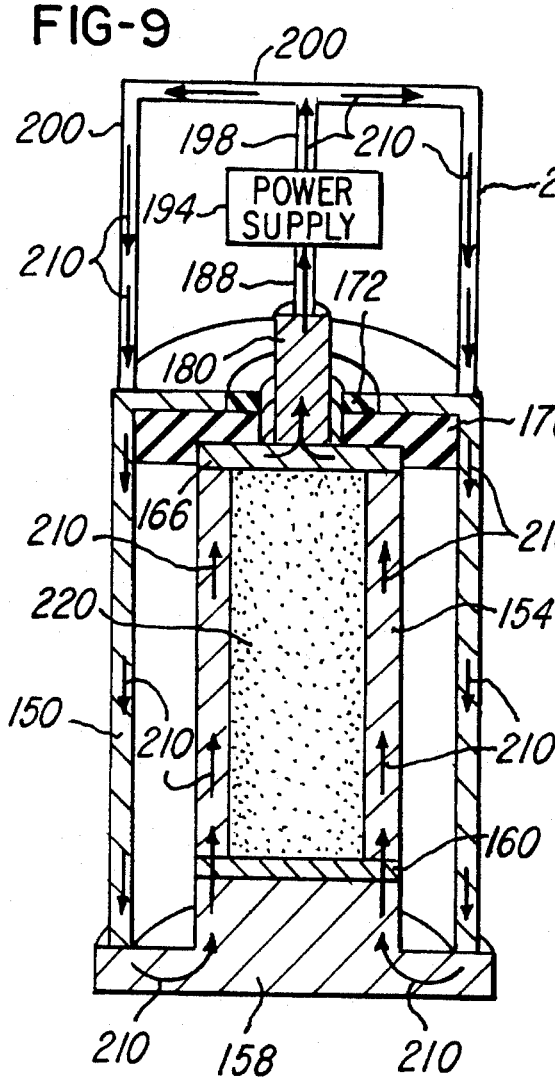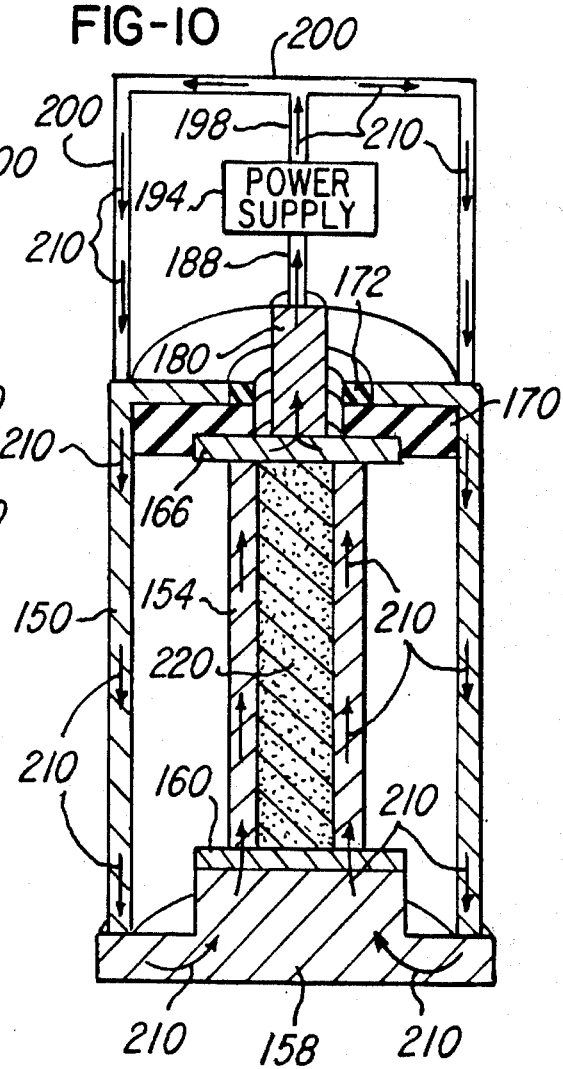

STRUCTURE AND METHOD FOR COMPACTION OF POWDER-LIKE MATERIALS

RELATED APPLICATION

This application is a continuation-in-part of application Ser. No. 07/834,148, filed Feb. 10, 1992, now U.S. Pat. No. 5,405,574.

BACKGROUND OF THE INVENTION

Several methods have been employed for forming particulate or powder-like materials into a unitary firmly compacted body of material.

Powdered metal bodies have been formed by means of pressure and heat. Such a method has also been used for forming unitary bodies from other powder or particulate materials.

A problem has specifically existed with regard to forming superconducting powders into a unitary firmly compacted body. Ceramic superconducting powders are normally prepared by proportioning the specific quantities of selected oxides. The combination is then thoroughly mixed by conventional means and then fired at elevated temperatures in suitable gaseous atmospheres. The induced solid state reaction causes the formation of the desired ceramic compositions and lattice structures.

In ceramic superconductors, the superconductivity within individual crystallites is proximity coupled to neighboring grains. Consequently, the orientation and coupling between crystallites are key factors affecting the current carrying capacity of the bulk ceramic superconductors. Voids, cracks, and grain boundaries act as weak links between crystallites and reduce the critical currents within the bulk material. Therefore, a technique which produces dense ceramics with good intergrain coupling and by which the material is formable into desired shapes to yield a required superconducting characteristic is of significant value.

At the present time several methods are used for obtaining high critical current densities in bulk superconducting materials.

One method employed is that of melt textured growth of polycrystalling material. This method is discussed in a paper included in Volume 37, No. 13, May 1, 1988, Physical Review B, S. Gin, et al, entitled: *Melt-Textured Growth of Polycrystaline*. This method consists of heating a bulk specimen of the high temperature material in a furnace to temperatures at which partial melting occurs. A temperature gradient is maintained in the furnace, and the superconductor is melted and recrystallised as the specimen is passed through the hot zone. Highly textured material is produced through this method and at present is shown to yield high Jc values. This method is generally limited to the processing of small length samples.

Another method is that of placing powder in a tube. This "powder in tube" method is discussed in a paper 1989 Applied Physics Letters, page 2441, prepared by K. Heine, et al, entitled: *High-Field Critical Current Densities*. In the "powder in tube" method, mechanical deformation is used to align plate-like particles of bismuth based superconductors. The powder is loaded into a tube of silver material and the assembly is compacted by swaging, drawing or rolling. A silver sheath provides a path to shunt currents across any defects. The material is subsequently heat treated to obtain the optimum superconductor characteristics.

However, as a result of the nature of varied mechanical operation involved in the two methods discussed above, reproducing the many processing steps repeatedly during fabrication of long lengths of wires and tapes remains unsatisfactory.

Another method of compaction is that of hot extrusion. This method is discussed in an article entitled: *Hot Extrusion of High-temperature Superconducting Oxides* by Uthamalingam Balachandran, et el, American Ceramic Bulletin, May 1991, page 813.

Another method is discussed in U.S. Pat. No. 5,004,722, *Method of Making Superconductor wires By Hot Isostatic Pressing After Bending*.

Another compaction technique which has been employed pertains to a shock method. This method is discussed in an article entitled: *Crystallographically oriented superconducting $Bi_2Sr_2CaCu_2O_8$ by shock compaction of prealigned powder* by C. L. Seaman, et al, in Applied Physics Letters 57, dated Jul. 2, 1990, page 93.

Another method of compaction is that known as an explosive method, discussed in an article entitled: *Metal Matrix High-Temperature Superconductor*, by L. E. Murr, et al, in Advanced Materials and Processes Inc. Metal Progress, October 1987, page 37.

These methods are limited in value because they are generally applicable only to production of small body sizes.

The application of large uniaxial static pressures at elevated temperatures is discussed in an article entitled: *Densification of $YBa_2Cu_2O_{7-8}$ by uniaxial pressure sintering*, by S. L. Town, et al, in Cryogenics, May 1990, Volume 30.

The use of electromagnetic forming for the purpose of attachment is discussed in a paper entitled: *Electromagnetic Forming*, by J. Bennett and M. Plum, published in Pulsed Power Lecture Series, Lecture No. 36.

However, processing of long lengths of homogenous and high quality superconducting tapes or wires by the processes discussed above has not been realized.

It is an object of this invention to provide a method and means for producing high density bodies by the use of powder-like and/or particulate materials.

It is another object of this invention to provide a method and means for producing electrical conductors by the use of powder-like or particulate materials.

It is another object of this invention to provide a method and means for producing high quality and continuous superconducting electrical conductors such as wires and tapes.

It is another object of this invention to provide such a method which can be consistently precisely duplicated in the quality of production.

Other objects and advantages of this invention reside in the structures and the construction of parts, the combination thereof, and the methods employed, as will become more apparent from the following description.

SUMMARY OF THE INVENTION

In this invention, powder-like and/or particulate materials or the like are compacted into high density bodies. The high density bodies can be of various shapes and sizes, and may, for example, be bodies such as rods, tapes, tubes, or plates or wheels or any other suitably shaped or desirably shaped bodies.

One method and related structure of this invention applies pressures generated by non-contact electromagnetic forces.

These electromagnetic pressures are generated by employing suitably shaped coils, such as solenoids or the like which have the necessary current carrying capacity. In this process a suitable electrically conductive container is encompassed by such a coil or solenoid. Within the electrically conductive container powder-like material is enclosed. When high magnitudes of electrical current are passed through the solenoid or coil, very high pressures are applied to the electrically conductive container, and the electrically conductive container is reduced in transverse dimensions. Thus, the powder-like material within the electrically conductive container is compacted into a body of high density.

With regard to this invention, compaction of particulate material is preferably performed by electromagnetic compaction as electrical energy is applied in short time pulses.

In one embodiment of this invention particulate material is compressed by means of a magnetizable wall or other type of pressure member which is moved by electromagnetic forces.

Pressures which are applied by the methods and/or structures of this invention may be applied to particulate material upon which no prior compaction pressure has been applied. Pressures which are applied by the methods and/or structures of this invention may be applied to a body of particulate material which has earlier received compaction pressure by mechanical means or by other types of pressure application. If a body of particulate material has been compacted by mechanical means or by any other means, additional application of compaction pressure in accordance with a method and/or structure of this invention may be referred to as a restrike application of compaction pressure.

Numerous types of rigid bodies are comprised of particulate material in which the particulate material is compressed by mechanical means. Each particle in a body of particulate material has a thermal time constant which is related to the size of the particle of a given material, and which is also related to the thermal conductivity of the particle and which is also related to the heat capacity of the particle, and which is also related to the density of the particle. Thus, the relationship is as follows:

$$T = \frac{DC}{K} R^2$$

in which T represents the thermal time constant of the particle, D represents the density of the particle, C represents the heat capacity of the particle, K represents the thermal conductivity of the particle, and R represents the size of the particle. Each of these factors is related to the material of which the particle is comprised.

In regard to this invention, it has been found that if electrical magnetic compaction of a given magnitude of pressure occurs in a time period which is less than the thermal time constant of a particle upon which pressure is applied, then the particle will have greater compressibility, that is, the particle will have greater compressibility than the compressibility which occurs when mechanical pressure of the same magnitude is applied. The relationship in regard to this statement is as follows: When the pulse time of applied magnetic pressure is less than the thermal time constant of the particle greater compressibility of the compressed particle is obtained.

Example for particulate steel:
D=7870 kg/m³
C=473 J/kg °K.
K=40 w/m °K.

So for R=50×10⁻⁶ m

T is less than 233×10⁻⁶ seconds

In which T represents the pulse time of applied magnetic pressure; J represents joules; kg represents kilograms; °K. represents degrees Kelvin; w represents watts; m represents meters.

Furthermore, in regard to this invention, it has been found that the density of a body which comprises particulate material can be increased by a predetermined number of applications of electromagnetic pulses of short time duration, each of the pulses having a pulse time which is less than the thermal time constant of the particle. Therefore, no intermediate sintering or heat treating is required. For example: for compaction of a body of an alloy powder of steel, three (3) pulses provide optimum or maximum density in the body. For compaction of a body of particulate copper, two (2) pulses create optimum or maximum density in the body. For compaction of bodies of other materials in particulate form, the number of pulses to obtain maximum density may be more than or fewer than two or three.

In one embodiment of this invention particulate material is placed upon an electrically conductive strip, and the strip is formed into a tubular member, thus enclosing the particulate material. The tubular member is encompassed by a solenoid or coil. High current levels are passed through the solenoid or coil, and a high magnitude of resulting electromagnetic pressure is applied to the tubular member. The transverse dimensions of the tubular member are significantly reduced and the particulate material within the tubular member is thus firmly compacted. If desired, this process can be performed in a continuous manner, so that an elongate conductor of compacted material is produced. This compaction method of this invention is capable of producing wire or tape or the like.

BRIEF DESCRIPTION OF THE VIEWS OF THE DRAWINGS

FIG. 1 is a perspective diagrammatic view illustrating a structure and a method of compaction of powder-like materials in accordance with this invention.

FIG. 2 is a perspective diagrammatic type of view illustrating a method and structure in accordance with this invention for producing in a continuous process an elongate member, which may be referred to as a wire, or tape, or the like. The process illustrated can be employed for production of an elongate member of material.

FIG. 3 is a fragmentary perspective sectional diagrammatic view illustrating another embodiment of structure for compaction of particulate material in accordance with this invention.

FIG. 4 is a fragmentary perspective sectional diagrammatic view, similar to FIG. 3, showing the structure as it contains particulate material prior to compaction of the particulate material.

FIG. 5 is a fragmentary perspective sectional diagrammatic view, similar to FIGS. 3 and 4, illustrating the structure and particulate material after compaction of the particulate material.

FIG. 6 is a perspective view illustrating a wheel-like body which has been produced by the structure of FIG. 3.

FIG. 7 is a sectional diagrammatic view illustrating another embodiment of the structure of this invention. This view also shows particulate material within a portion of the structure.

FIG. 8 is a sectional diagrammatic view, similar to FIG. 7, showing the structure of FIG. 7 and showing the particulate material after compaction thereof.

FIG. 9 is a sectional diagrammatic view illustrating another embodiment of the structure of this invention. This view shows particulate material within the structure prior to compaction of the particulate material.

FIG. 10 is a sectional diagrammatic view, similar to FIG. 9, showing the structure and the particulate material after compaction of the particulate material.

DETAILED DESCRIPTION OF THE PREFERRED EMBODIMENT

FIG. 1 shows a direct current power supply 20 to which is connected electric conductors 22 and 24. Connected to the conductor 22 is a switch 26 which is also connected to a conductor 28. The conductor 28 and the conductor 24 have joined therebetween a capacitor 30. The conductor 28 is also connected to a switch 32 which is also connected to a conductor 34. The conductor 24 and the conductor 34 are connected to a solenoid or coil 36 which encompasses an electrically conductive container 38. The electrically conductive container 38 is shown as being rectangular in transverse dimensions. However, the electrically conductive container 38 may be of any suitable or desired shape and size. The electrically conductive container 38 may be of any suitable electrically conductive material, such as, for example, of silver material.

Within the electrically conductive container 38 is a quantity of powder material 40. The powder material 40 completely fills the electrically conductive container 38 and is firmly positioned therewithin.

In carrying out the process of this invention, the switch 26 is closed, and the capacitor 30 is charged from the power supply 20. After the capacitor 30 is completely charged, the switch 26 is opened and the switch 32 is closed. When the switch 32 is closed a large quantity of electrical current flows from the capacitor 30 through the solenoid or coil 36. When electrical current flows through the coil or solenoid 36 magnetic pressure is applied upon the electrically conductive container 38. This pressure acts inwardly upon the electrically conductive container 38, and the transverse dimensions of the electrically conductive container 38 are reduced. Thus, compression occurs within the electrically conductive container 38, and the powder-like material 40 within the electrically conductive container 38 is compressed and compacted. Thus, the powderous material 40 within the electrically conductive container 38 becomes a dense body.

As an example or illustration, the electrically conductive container 38 may have a transverse dimension of less than one inch or several inches, and current flow through the solenoid 36 may be in the order of about 100,000 amperes at a voltage of about 4,000 volts. It is to be understood, of course, that other magnitudes of current may be employed as found to be suitable in accordance with the size and physical characteristics of the electrically conductive container 38 and the physical characteristics and volume of the powder-like material 40. It is also to be understood that when the powder-like material 40 has good electrically conductive properties, a container may not be necessary or the container of the particulate material may not need to be electrically conductive for compaction of the particulate material in accordance with the method and/or structure of this invention.

Due to the fact that the solenoid or coil 36 tends to expand radially as current flows therethrough, suitable means are employed to restrain the coil 36 against lateral expansion as current flows therethrough. For example, as shown, a rigid wall 44 closely encompasses the coil 36 and restrains the coil 36 against expansion as current flows therethrough.

FIG. 2 illustrates structure and a method of the construction of an elongate body, such as a wire or tape or rod in accordance with this invention. A strip of electrically conductive material 50 in a flat condition is moved longitudinally as illustrated by arrows 52. A powderous material 54 having desired physical or electrical properties is poured upon the strip 50. When a superconductive body is desired, the powderous material 54 is superconductive material. Thus, the strip 50 carries the powder-like material 54.

Then by any suitable means, such as by means of a forming unit 55, the strip 50 is formed into a tubular member 50a, as the tubular member 50a encloses and carries the powder-like material 54. Then the diameter of the tubular member 50a is reduced as the tubular member 50a is drawn through a drawing unit 57. Thus, the diameter of the tubular member 50a is reduced as elongation of the tubular member 50a occurs. Thus, a degree of compaction of the powder-like material occurs as drawing and elongation of the tubular member 50a occurs.

Then the tubular member 50a is moved into the confines of a solenoid or a coil 56. The coil 56 is energized from a power source 60. Electrical conductors 62 and 64 are connected to the power source 60. Joined to the conductor 64 is a switch 66. A conductor 67 is also connected to the switch 66. Connected to the conductors 62 and 67 is a capacitor 68. Also connected to the conductor 67 is a switch 72. Also connected to the switch 72 is a conductor 74. The conductor 74 and the conductor 62 are joined to the solenoid or coil 56.

In accordance with the method of this invention, the capacitor 68 is charged from the power source 60 as the switch 66 is closed. Then the switch 66 is opened, and the switch 72 is closed so that a large magnitude of current flows from the capacitor 68 through the coil or solenoid 56, as illustrated by arrows 76. The flow of current through the coil 56 may be in the order of several thousand amperes. When this flow of current through the solenoid or coil 56 occurs a high magnitude of magnetic pressure is applied to the tubular member 50a. The pressure upon the tubular member 50a causes reduction of the transverse dimension of the tubular member 50a. Thus, the powder material 54 within the tubular member 50a becomes very firmly compacted. Due to the fact that the coil 56 tends to expand during current flow therethrough, a wall 80 closely encompasses the coil 56 and restrains the coil 56 against radial and axial expansion.

If desired, after the tubular member 50a passes through the electrical coil 56, the tubular member 50a, with the powderous material 54 compacted therewithin, may pass through a sintering operation 84. The sintering operation 84 improves the properties of the compacted powder-like material 54. Power driven roller means 85 are shown for moving the tubular member 50a.

By this means and method, a desired elongate body can be produced. By this means and method a superconducting wire or tape or the like can be produced. As illustrated, the process can be a continuous process. By continuously moving the tubular member 50a through the solenoid 56 while current flows through the 56, continuous lengths of tubes are compacted, and a continuous length of electrical conductor of superconducting material is produced. Thus, superconductors of any desired shape and size and/or length can be produced in a single operation or in a continuous operation or in plurality of operations. Long lengths of superconducting material can be repeatedly and precisely produced by this non-contact method. After processing, the wire of superconducting material may be wound into a coil 86, as shown in FIG. 2.

The method and structure shown in FIG. 2 have been found to be successful in creating a wire-like conductor of superconducting material. As an example or illustration, a wire of superconducting material was produced in which the strip 50 was approximately one-half inch in width and approximately fifteen thousandths of an inch in thickness. The superconductive powder material 54 employed was Bi(Pb)SrCaCuO. The current flow through the coil 56 was in the order of about one hundred thousand amperes. After travel through the coil 56 the transverse dimension of the tubular member 50a was about one-eighth of an inch.

It is to be understood that the method of this invention can be employed in compacting most types of powder-like or powderous materials, such as ceramic compounds, ceramic and metal composites, metals, metal alloys, and metal compounds.

FIGS. 3, 4, and 5 illustrate another embodiment of structure of this invention for compaction of particulate material. These figures show an electrical coil 90 which encompasses a solid support member 92. The electrical coil 90 has connection portions 94 and 96, for connection to a suitable power supply, not shown. A housing 100 encloses the electrical coil 90 and the support member 92. The housing 100 has an annular inner toothed region 101. FIG. 4 shows particulate material 102 within the housing 100. A portion of the particulate material 102 engages the toothed region 101. A wall member 104 separates the particulate material 102 from the electrical coil 90. The wall member 104 comprises electrically conductive material, such as aluminum or the like. The wall member 104 is expandable in length or circumference.

When the electrical coil 90 is energized by a suitable magnitude of electrical current, a magnetic field is created and magnetic pressure is applied to the electrically conductive wall member 104. When magnetic pressure is applied to the wall member 104, the wall member 104 moves toward the particulate material 102. The wall member 104 expands in circumference and pressure is applied to the particulate material 102, within the housing 100.

Therefore, as illustrated by FIG. 5, the particulate material 102 is compressed and a highly dense body of particulate material is formed. Therefore, as illustrated in FIG. 6, an annular toothed wheel 102A or the like is formed by the structure and method of this invention.

After production of the toothed wheel 102A, the wall member 104 may be removed from the toothed wheel 102A or left upon the toothed wheel 102A to be used as a part of the toothed wheel 102A.

If the particulate material 102 includes electrically conductive material, the wall member 104 may not need to be electrically conductive, and it may not be necessary to move the wall member 104 toward the particulate material 102 for compaction of the particulate material 102 by means of magnetic pressure applied by energization of the electrical coil 90.

FIGS. 7 and 8 illustrate another embodiment of the structure of this invention. The structure of FIGS. 7 and 8 comprises a first housing member 112 and a second housing member 116. The first housing member 112 has a recess 118, within which an electrically conductive stem 120 is movably positioned. Encompassing the stem 120 is an electrically conductive coil 124, which has connection portions 128 and 130. A packer member 134 is attached to the stem 120. The second housing portion 116 has a chamber 140 which is adapted to retain particulate material 144, as shown in FIG. 7.

When the electrically conductive coil 124 is energized a magnetic field is created and magnetic forces upon the stem 120 and the packer member 134 force the packer member 134 into the chamber 140, and pressure is applied to the particulate material 144. The pressure applied to the particulate material 144 compacts the particulate material 144, and a rigid body 44A is formed, as shown in FIG. 8.

FIGS. 9 and 10 illustrate another embodiment of the structure of this invention. An outer housing 150 encloses an inner housing 154. The outer housing 150 is shown as engaging a base 158. A plate 160 divides the base 158 from one end part of the inner housing 154. At the other end of the inner housing 154 a plate 166 separates the inner housing 154 from insulator members 170 and 172. The outer housing 150 and the inner housing 154 and the base 158 and the plate 66 are constructed of electrically conductive material.

In engagement with the plate 166 and extending therefrom is an electrically conductive member 180. The electrically conductive member 180 extends through the insulator member 172. A wire-like electric conductor 188 joins the electrically conductive member 180 to a power supply unit 194. A wire-like electric conductor 198 joins the power supply unit 194 to wire-like electric conductor member 200. The electric conductor member 200 is shown as having two portions, each of which is connected to the outer housing 150. Electric current is shown by arrows 210 as traveling from the power supply unit 194, through the electric conductor 200 to the outer housing 150. Electric current flows through the outer housing 150, through the base 158, and through the plate 160. The electric current then flows from the plate 160 through the inner housing 154 and through the plate 166, and through the electrically conductive member 180, to the wire-like electric conductor 188, and into the power supply unit 194. Thus, an electric current circuit is established, and current flows substantially as indicated by the arrows 210.

The inner housing 154 is adapted to contain particulate material 220. FIG. 9 shows the particulate material 220 prior to compaction thereof. When electrical current flows in the manner illustrated by the arrows 210, electromagnetic pressure is created upon the inner housing 154. The inner housing 154 is formed by wall members which are of flexible material, such as aluminum or the like. Thus, when magnetic pressure is applied upon the inner housing 154, the transverse dimension and circumference of the inner housing 154 is decreased, as illustrated in FIG. 10. Thus, the particulate material 220 within the inner housing 154 is compressed, as illustrated in FIG. 10. As the diameter and circumference of the inner housing decreases, there is sliding action between the inner housing 154 and the plate 160 and the plate 166. Thus, a body of dense particulate material 220 is formed, as shown in FIG. 10.

Therefore, it is understood that the structure and method of this invention are effective in compaction of particulate materials. Particulate material can be compacted by non-contact electrically conductive means, or compaction pressure can be applied to particulate material by means of an electrically conductive pressure member which is moved by magnetic forces upon the pressure member.

Also, it is to be understood that the structure and method of this invention are capable of providing greater compressibility and greater density to a body of particulate material than is possible by mechanical means of the same magnitude of pressure.

It is also to be understood that the structure and method of this invention may be applied for production of bodies of particulate material of any one of various sizes and shapes and any one of various materials.

Although the preferred embodiment of the structure and method for compaction of particulate materials of this invention has been described, it will be understood that within the purview of this invention various changes may be made in the structure and/or method, or in the form, details, proportion and arrangement of parts, or the combination thereof, which generally stated consist in a structure and method within the scope of the appended claims.

The invention having thus been described, the following is claimed:

1. A structure for producing a dense body using a powder material, comprising:

a retainer for retaining the powder material, an electrically conductive pressure member movable toward the powder material which is retained by the retainer, an electrically conductive driver positioned adjacent the electrically conductive pressure member, an electrical energy supply source to energize the electrically conductive driver for energization of the electrically conductive driver to apply electromagnetic pressure to the electrically conductive pressure member without direct electrical contact to drive the electrically conductive pressure member to compress the particulate material to produce said dense body.

2. A structure for increasing the density of a powder, comprising:

a support for receiving and supporting the powder, an electrically conductive driver positioned adjacent the support, a connector for connecting the driver to a source of electrical energy for energization of the driver to create a magnetic field for applying pressure to the powder without direct electrical contact therebetween to increase the density thereof, thereby producing an integral part from said powder.

3. The structure of claim 2 in which the electrically conductive driver and the powder are in adjacent relationship so that one of them is positioned in adjacent relationship to the other.

4. The structure of claim 2 which includes an electrically conductive wall member positioned between the powder and the electrically conductive driver, the electrically conductive wall member including a movable portion, whereby energization of the electrically conductive driver creates a magnetic field within the electrically conductive wall member and applied electromagnetic pressure to the electrically conductive wall member and a movable portion of the electrically conductive wall member is moved toward the powder and pressure is applied to the powder for increasing the density of the powder to form a densified body.

5. The structure of claim 2 which comprises an electrically conductive wall member which is positioned between the powder and the electrically conductive driver and in which the electrically conductive wall member encompasses the powder.

6. The structure of claim 2 which comprises an electrically conductive wall member which is positioned between the powder and the electrically conductive driver and in which the powder encompasses the electrically conductive wall member.

7. A structure for producing a dense body of particulate material, comprising:

a container provided with an annular recess for retaining particulate material, the container also being provided with an inner chamber, the annular recess encompassing the inner chamber, an electrical conductor driver positioned within the inner chamber and energizable to create a magnetic field and to apply electromagnetic pressure toward the annular recess for applying pressure upon particulate material which is within the annular recess, whereby the particulate material within the recess is compressed to provide a dense body without direct electrical contact between said driver and said material.

8. The structure of claim 7 which includes an electrically conductive pressure member positioned between the inner chamber and the annular recess, the electrically conductive pressure member being movable by the magnetic field toward the annular recess for applying pressure upon particulate material which is within the annular recess.

9. The structure of claim 7 which includes an annular electrically conductive wall member positioned between the inner chamber and the annular recess, the annular electrically conductive wall member having movable portions, the annular electrically conductive wall member being energized by the magnetic field with energization of the electrical conductor driver, whereby movable portions of the annular electrically conductive wall member are movable toward the annular recess for applying pressure upon particulate material which is within the annular recess for providing an annular body of compacted particulate material.

10. A magnetic compactor device for producing a wheel which is comprised of compressed particulate material, comprising a container, the container being provided with an annular recess, the annular recess being adapted to retain particulate material, an electrical conductor adjacent the annular recess, a cylindrical electrically conductive wall member positioned between the annular recess and the electrical conductor, the electrical conductor being energizable to create a magnetic field and to apply magnetic pressure upon the cylindrical electrically conductive wall member to move the cylindrical electrically conductive wall member toward the recess to compress the particulate material to produce said wheel without direct electrical contact between the electrical conductor and the wall member.

11. A structure for producing a dense body of particulate material, comprising a housing, an electrically conductive stem having a portion within the housing, the electrically conductive stem being movable with respect to the housing, an electrical conductor encompassing the stem, the electrical conductor being energizable to create a magnetic field and to apply electromagnetic force to the electrically conductive stem for movement of the electrically conductive stem with respect to the housing, a retainer adjacent the housing for retaining said particulate material, whereby energization of the electrical conductor creates a magnetic field which moves the electrically conductive stem and the engagement means toward the retainer and toward the particulate material within the retainer and compaction pressure is applied to the particulate material and the particulate material is compressed and a dense body of particulate material is produced without direct electrical contact between the electrical conductor and the retainer.

12. A structure for producing a body of compacted particulate material comprising a cylinder for receiving electrically conductive material, said cylinder having movable wall portions, for receiving electrically conductive material, means for applying magnetizing energy to the cylinder to create a magnetic field which is applied to the cylinder for slidably moving the movable wall portions of the cylinder to apply pressure upon particulate material within the cylinder for compacting the particulate material to provide an internal body of compacted particulate material without direct electrical contact between said driver and said cylinder.

13. A structure for producing a body of compacted particulate material comprising cylinder means, the cylinder means having movable wall portions, stationary plates at the respective ends of said removable wall portions, slidable engagement means slidably engaging the movable wall portions of the cylinder, the cylinder means being adapted to contain particulate material, the cylinder means including electrically conductive material, a driver for applying magnetizing energy to the cylinder means to create a magnetic field which is applied to the cylinder means for slidably moving the movable wall portions of the cylinder means to apply pressure upon particulate material which is within the cylinder means for compacting the particulate material and providing a body of compacted particulate material in which the cylinder means comprises an inner cylinder and an outer cylinder, the inner cylinder having movable wall portions containing the particulate material and being slidably movable upon the slidable engagement means, the outer cylinder and the inner cylinder being of electrically conductive material, means for conducting flow of electrical current within the outer cylinder, whereby electrical current flowing in the outer cylinder creates a magnetic field which is applied to the inner cylinder for slidably moving the movable wall portions of the inner cylinder along said stationary plates to apply pressure upon the particulate material within the inner cylinder for compacting the particulate material within the inner cylinder and providing a body of compacted particulate material.

14. Structure for producing a body of compacted particulate material, comprising a first wall member and a second wall member, the first wall member and the second wall member being in adjacent relationship, the first wall member having an electrically conductive movable portion adapted to contain particulate material, electrically conductive slide engagement means slidably engaging the electrically conductive movable portion of the first wall member, the electrically conductive movable portion of the first wall member having a first position and a second position, the second wall member being of electrically conductive material, means for establishing flow of electrical current through the second wall member for creating an electromagnetic field within the first wall member for moving the electrically conductive movable portion of the first wall member from the first position thereof to the second position thereof for compressing and compacting the particulate material which is contained by the electrically conductive movable portion of the first wall member and producing a body of compacted particulate material.

* * * * *

UNITED STATES PATENT AND TRADEMARK OFFICE
CERTIFICATE OF CORRECTION

PATENT NO. : 5,611,139
DATED : March 18, 1997
INVENTOR(S) : Chelluri et al.

It is certified that error appears in the above-indentified patent and that said Letters Patent is hereby corrected as shown below:

On the title page: Item [56]

In the Other Publications section of the References Cited Section, on page 1, in the second column, at line 8, in the Seaman et al. reference, please delete "*Crystallographicallyoriented superconducting*" and insert --*Crystallographically Oriented Superconducting*-- therefor.

In the Other Publications section of the References Cited Section, on page 1, in the second column, at line 9, in the Seaman et al. reference, please delete "*bi$_2$Sr$_2$CaCu$_2$O$_8$by shock compaction of prealigned powder*" and insert --*Bi$_2$Sr$_2$CaCu$_2$O$_8$ by Shock Compaction of Prealigned Powder*-- therefor.

In the Other Publications section of the References Cited, on page 2, in the first column. at line 1, in the Town et al. reference, please delete " *YBA$_2$Cu$_2$O$_{7-8}$by uniaxial pressure sintering*" and insert --*YBa$_2$Cu$_2$O$_{7-8}$ by Uniaxial Pressure Sintering*-- therefor.

In the Specification, in column 2, at line 12, please delete "*wires*" and insert --*Wires*-- therefor.

In the Specification, in column 2, at line 16, please delete "*oriented superconducting*" and insert --*Oriented Superconducting*-- therefor.

In the Specification, in column 2, at line 17, please delete "*shock compaction of prealigned*" and insert --*Shock Compaction of Prealigned*-- therefor.

UNITED STATES PATENT AND TRADEMARK OFFICE
CERTIFICATE OF CORRECTION

PATENT NO. : 5,611,139
DATED : March 18, 1997
INVENTOR(S) : Chelluri et al.

It is certified that error appears in the above-indentified patent and that said Letters Patent is hereby corrected as shown below:

In the Specification, in column 2, at line 18, please delete "*powder*", and insert --*Powder*-- therefor.

In the Specification, in column 2, at line 19, please delete "*uniaxial pressure sintering*", and insert --*Uniaxial Pressure Sintering*-- therefor.

In the Specification, in column 8, at line 14, please delete "44A", and insert --144A-- therefor.

In the Specification, in column 8, at line 23, please delete "66", and insert --166-- therefor.

In the Claims, in claim 12, in column 11, at line 9, please delete "internal", and insert --integral-- therefor.

Signed and Sealed this

Sixteenth Day of September, 1997

Attest:

BRUCE LEHMAN

*Attesting Officer*   Commissioner of Patents and Trademarks